(12) United States Patent
Miyamoto et al.

(10) Patent No.: US 11,069,593 B2
(45) Date of Patent: Jul. 20, 2021

(54) SEMICONDUCTOR DEVICE

(71) Applicant: Mitsubishi Electric Corporation, Tokyo (JP)

(72) Inventors: Noboru Miyamoto, Tokyo (JP); Taishi Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/900,885

(22) Filed: Feb. 21, 2018

(65) Prior Publication Data
US 2018/0374772 A1    Dec. 27, 2018

(30) Foreign Application Priority Data

Jun. 26, 2017    (JP) ............................. JP2017-123955

(51) Int. Cl.
*H01L 23/48* (2006.01)
*H01L 23/367* (2006.01)
(Continued)

(52) U.S. Cl.
CPC ........ *H01L 23/3675* (2013.01); *H01L 23/051* (2013.01); *H01L 23/562* (2013.01)

(58) Field of Classification Search
CPC .......................... H01L 23/562; H01L 23/3675
See application file for complete search history.

(56) References Cited

U.S. PATENT DOCUMENTS

| 4,106,052 A * | 8/1978 | Schierz .................... H01L 23/24 |
| | | 257/687 |
| 4,796,156 A * | 1/1989 | Webster ................... H01L 23/04 |
| | | 257/E21.511 |

(Continued)

FOREIGN PATENT DOCUMENTS

| DE | 11 2015 003 141 T5 | 4/2017 |
| JP | H11-204703 A | 7/1999 |

(Continued)

OTHER PUBLICATIONS

An Office Action mailed by the Japanese Patent Office dated Mar. 17, 2020, which corresponds to Japanese Patent Application No. 2017-123955 and is related to U.S. Appl. No. 15/900,885.
An Office Action mailed by the Japanese Patent Office dated Jun. 16, 2020, which corresponds to Japanese Patent Application No. 2017-123955 with English Translation.
An Office Action mailed by the German Patent Office dated Jun. 19, 2020, which corresponds to German Patent Application No. 10 2018 209 2311 and is related to U.S. Appl. No. 15/900,885.

*Primary Examiner* — Hoa B Trinh
(74) *Attorney, Agent, or Firm* — Studebaker & Brackett PC

(57) ABSTRACT

Provided is a technique for preventing warps of cooling plates due to a contraction of a joining material, thereby preventing a reduction in cooling performance of a semiconductor device. The semiconductor device includes the following: a first cooling plate; a second cooling plate facing the first cooling plate; a semiconductor chip joined between the circuit pattern of the first cooling plate and the circuit pattern of the second cooling plate with a joining material; and a case containing part of the first cooling plate, part of the second cooling plate, and the semiconductor chip. The semiconductor chip is mounted in a semiconductor-chip mounting part between the first cooling plate and the second cooling plate. The case is provided with a portion corresponding to the semiconductor-chip mounting part and to surroundings thereof. The portion has an up-and-down width greater than an up-and-down width of the remaining portions of the case.

9 Claims, 3 Drawing Sheets

(51) Int. Cl.
*H01L 23/00* (2006.01)
*H01L 23/051* (2006.01)

(56) References Cited

U.S. PATENT DOCUMENTS

| | | | | |
|---|---|---|---|---|
| 5,327,325 | A * | 7/1994 | Nicewarner, Jr. | H01L 23/057 174/564 |
| 7,279,789 | B2 * | 10/2007 | Cheng | H01L 25/105 257/713 |
| 2005/0151244 | A1 * | 7/2005 | Chrysler | H01L 23/473 257/713 |
| 2012/0181679 | A1 * | 7/2012 | Kadoguchi | H01L 23/3142 257/676 |
| 2013/0328185 | A1 | 12/2013 | Hiramitsu et al. | |
| 2015/0003019 | A1 * | 1/2015 | Ide | H01L 23/4334 361/705 |
| 2015/0016063 | A1 | 1/2015 | Higuma et al. | |
| 2015/0179620 | A1 * | 6/2015 | Miyamoto | H01L 25/16 257/712 |
| 2016/0056127 | A1 * | 2/2016 | Lee | H01L 23/49811 257/659 |

FOREIGN PATENT DOCUMENTS

| | | |
|---|---|---|
| JP | 2010-098097 A | 4/2010 |
| JP | 2013-211942 A | 10/2013 |
| JP | 2013-258334 A | 12/2013 |

* cited by examiner

F I G. 2
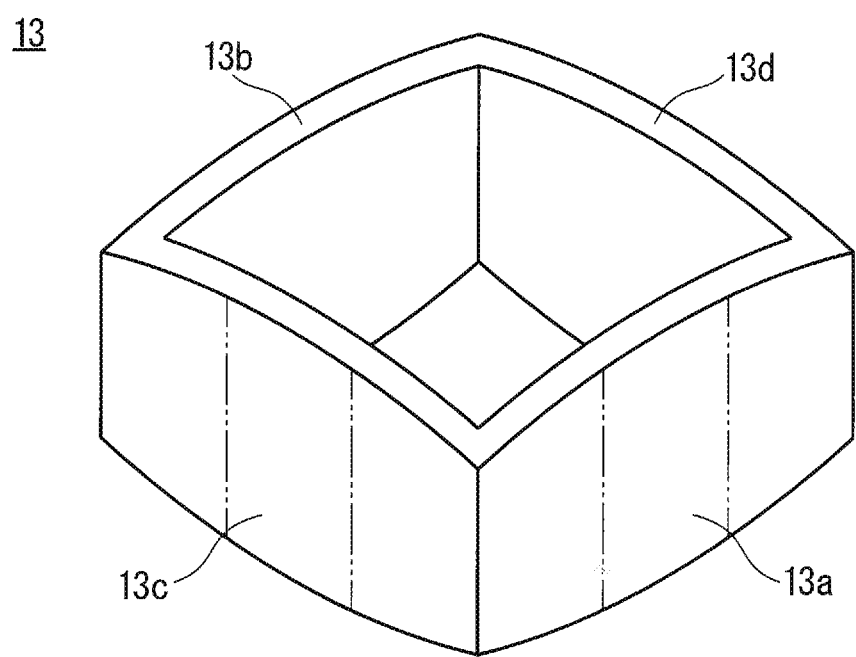

100A

SEMICONDUCTOR DEVICE

BACKGROUND OF THE INVENTION

Field of the Invention

The present invention relates to semiconductor devices including double-side cooling structures that cool both the upper and lower surfaces of semiconductor chips.

Description of the Background Art

Some semiconductor devices include double-side cooling structures that cool both the upper and lower surfaces of semiconductor chips. A conventional semiconductor device including such a double-side cooling structure is configured such that a pair of heat-dissipation plates made of Cu is joined to the upper and lower surfaces of a semiconductor chip with solder, and that an insulating material is sealed between the pair of heat-dissipation plates.

For instance, Japanese Patent Application Laid-Open No. 11-204703 proposes a semiconductor device including structures joined to the upper and lower surfaces of a semiconductor chip, the structures each including a thin insulating plate, a metal heat-dissipation plate stacked on the thin insulating plate, and a thin metal plate stacked on the metal heat-dissipation plate.

In the semiconductor device of Japanese Patent Application Laid-Open No. 11-204703, a joining material contracts when the semiconductor chip is joined to the thin metal plate. The contraction causes semiconductor-chip mounting parts of the thin metal plates to be drawn to the semiconductor chip. Accordingly, upper and lower cooling plates warp. As a result, the parallelism between the upper thin metal plate and the lower thin metal plate degrades, thereby reducing cooling performance of the semiconductor device.

SUMMARY

It is an object of the present invention to provide a technique for preventing warps of cooling plates due to a contraction of a joining material, thereby preventing a reduction in cooling performance of a semiconductor device.

The semiconductor chip according to an aspect of the present invention includes the following: a first cooling plate including a circuit pattern disposed on an insulator; a second cooling plate facing the first cooling plate and including a circuit pattern disposed on an insulator; a semiconductor chip joined between the circuit pattern of the first cooling plate and the circuit pattern of the second cooling plate with a joining material; and a case holding the outer peripheries of the first cooling plate and the second cooling plate, and containing part of the first cooling plate, part of the second cooling plate, and the semiconductor chip. The semiconductor chip is mounted in a semiconductor-chip mounting part between the first cooling plate and the second cooling plate. The case is provided with a portion corresponding to the semiconductor-chip mounting part and to surroundings thereof. The portion has an up-and-down width greater than an up-and-down width of the remaining portions of the case.

The case is provided with a portion corresponding to the semiconductor-chip mounting part and to surroundings thereof. The portion has an up-and-down width greater than an up-and-down width of the remaining portions of the case. Such a configuration prevents warps of the cooling plates during the contraction of the joining material when the semiconductor chip is joined to the cooling plates. Consequently, the upper cooling plate and the lower cooling plate maintain optimal parallelism therebetween, thereby preventing a reduction in cooling performance of the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a perspective view of a case included in the semiconductor device.

DESCRIPTION OF THE PREFERRED EMBODIMENT

Preferred Embodiment

Figure 1:
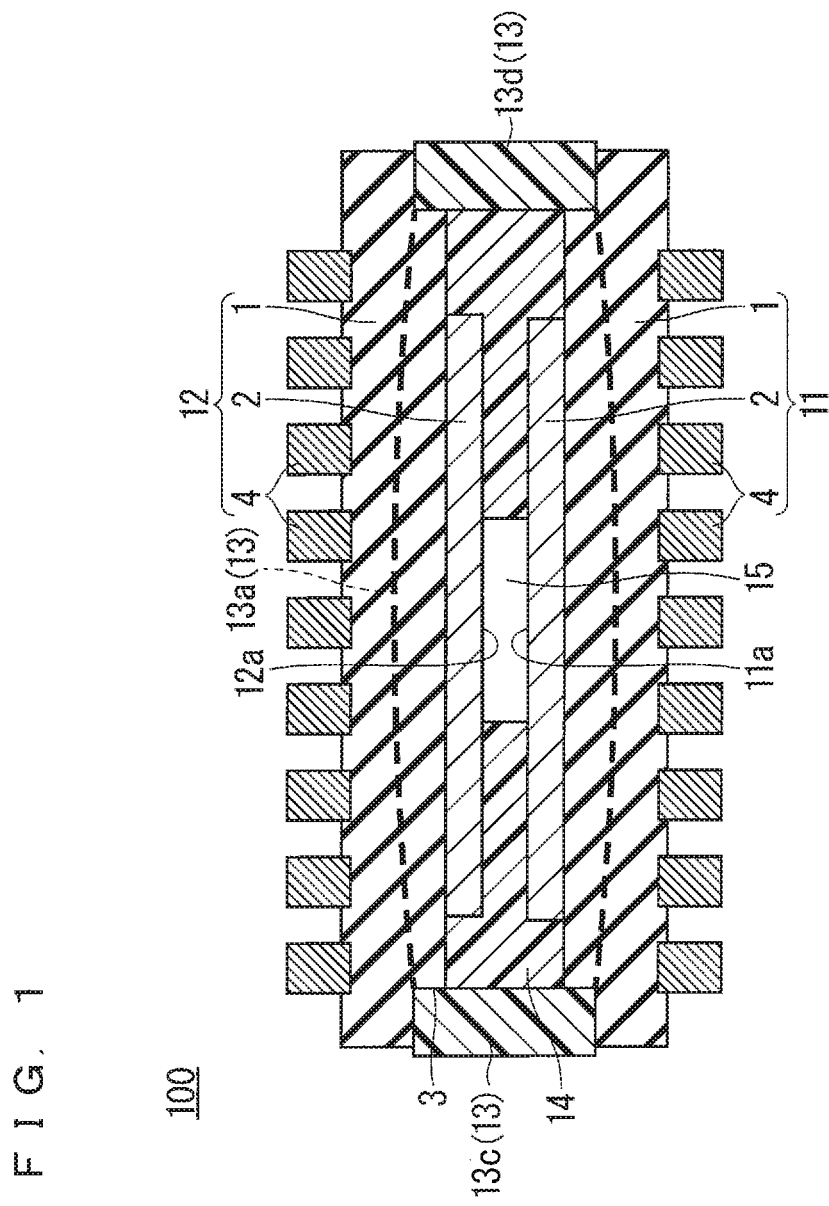
FIG. 1 is a cross-sectional view of a semiconductor device according to a preferred embodiment.

The following describes a preferred embodiment of the present invention with reference to the accompanying drawings. FIG. 1 is a cross-sectional view of a semiconductor device 100 according to the preferred embodiment. FIG. 2 is a perspective view of a case 13 included in the semiconductor device 100.

As illustrated in FIG. 1, the semiconductor device 100 includes a first cooling plate, which in the preferred embodiment is a cooling plate 11, a second cooling plate, which in the preferred embodiment is a cooling plate 12, a semiconductor chip 15, and a case 13. An example of the semiconductor device 100 is a motor-vehicle semiconductor module.

The cooling plate 11 includes an insulator 1 and a circuit pattern 2. The insulator 1 is a plate and is made of a material, such as $Si_3N_4$, AlN, $Al_2O_3$, and $ZrAl_2O_3$. The circuit pattern 2 is disposed inside the periphery on the upper surface of the insulator 1, and is integrated with the insulator 1. The circuit pattern 2 is made of metal such as Cu. The cooling plate 11 further includes a plurality of heat-dissipation fins 4 projecting from the lower surface of the insulator 1.

In each of the cooling plates 11 and 12, the insulator 1 and the circuit pattern 2 are integrated with each other. This eliminates the need for using grease between the insulator 1 and the heat-dissipation fins 4. Grease deteriorates the thermal resistances of semiconductor devices due to the pump-out of the grease. The semiconductor device 100, in which no grease is used between the insulator 1 and the heat-dissipation fins 4, reduces long-term variations in its thermal resistance.

The cooling plate 12 is the same as the cooling plate 11, and is formed such that the cooling plate 11 is turned upside down. The cooling plate 12 is disposed above the cooling plate 11 while facing the cooling plate 11.

The semiconductor chip 15 is mounted in semiconductor-chip mounting parts 11a and 12a between the circuit pattern 2 of the cooling plate 11 and the circuit pattern 2 of the cooling plate 12. More specifically, the upper surface of the semiconductor chip 15 is joined to the circuit pattern 2 of the cooling plate 12 with a joining material. Moreover, the lower surface of the semiconductor chip 15 is joined to the circuit pattern 2 of the cooling plate 11 with the joining material. An example of the joining material is solder.

The semiconductor chip 15 is connected to the circuit pattern 2 of the cooling plate 12 and the circuit pattern 2 of the cooling plate 11. This forms an electric circuit. Further, heat generated by the semiconductor chip 15 transfers to the heat-dissipation fins 4 via the circuit patterns 2 and the insulators 1. Accordingly, the heat is radiated from the heat-dissipation fins 4. In other words, the upper surface of the circuit pattern 2 of the cooling plate 11 is a cooling surface; so is the lower surface of the circuit pattern 2 of the cooling plate 12.

As illustrated in FIG. 1, the semiconductor-chip mounting part 11a is positioned in the middle of the upper surface of the circuit pattern 2 of the cooling plate 11; and the semiconductor-chip mounting part 12a, in the middle of the lower surface of the circuit pattern 2 of the cooling plate 12. It is noted that the positions and sizes of the semiconductor-chip mounting parts 11a and 12a vary depending on the number of semiconductor chips 15.

As illustrated in FIGS. 1 and 2, the case 13 includes a front side surface 13a, a rear side surface 13b, a left side surface 13c, and a right side surface 13d. Moreover, the case 13 is open in its up-and-down direction. The case 13 holds the outer peripheries of the cooling plates 11 and 12. The case 13 contains part of the cooling plate 11, part of the cooling plate 12, and the semiconductor chip 15. More specifically, the insulator 1 of the cooling plate 11 has an upper end portion thinner than the remaining portions in a lateral direction of the insulator 1. Moreover, the insulator 1 of the cooling plate 12 has a lower end portion thinner than the remaining portions in a lateral direction of the insulator 1. Accordingly, steps 3 are formed throughout the outer periphery of the upper end portion of the insulator 1 of the cooling plate 11 and the outer periphery of the lower end portion of the insulator 1 of the cooling plate 12.

The case 13 is fitted in the steps 3. Reference is made to the insulators 1 of the cooling plates 11 and 12. The portions, in which the case 13 is fitted, are thin in the lateral directions of the insulators 1, and the remaining portions are thick in the lateral directions of the insulators 1. The case 13 is made of resin, such as polyphenylene sulfide (PPS), polybutylene terephthalate (PBT), and epoxy. Since the front side surface 13a is positioned in front of the cross-section of FIG. 1 and thus is not seen in the cross-section of FIG. 1, the front side surface 13a is shown by dotted lines. An insulating material 14 is sealed inside the case 13, i.e., in a space defined by the cooling plates 11 and 12. The insulating material 14 is made of a material, such as resin and gel.

The following describes the shape of the case 13, which is a feature of the preferred embodiment. As illustrated in FIGS. 1 and 2, the case 13 is provided with a portion corresponding to the semiconductor-chip mounting parts 11a and 12a and to their surroundings. This portion has an up-and-down width greater than an up-and-down width of the remaining portions of the case 13. More specifically, the case 13 has an up-and-down width that continuously varies in a curved manner; that is, the upper end portion of the front side surface 13a of the case 13 is upwardly protuberant as the upper end portion approaches the middle of the front side surface 13a in its lateral direction, and the lower end of the front side surface 13a is downwardly protuberant as the lower end approaches the middle of the front side surface 13a in its lateral direction. The shapes of the rear side surface 13b, the left side surface 13c, and the right side surface 13d are similar to the shape of the front side surface 13a, and will not be elaborated upon here.

The up-and-down width of the case 13 does not necessarily need to continuously vary. In some embodiment, the upper end portion of the case 13 is upwardly protuberant and the lower end of the case 13 is downwardly protuberant only with respect to the portion of the case 13, corresponding to the semiconductor-chip mounting parts 11a and 12a and to their surroundings.

Herein, the portion of the case 13, corresponding to the semiconductor-chip mounting parts 11a and 12a and to their surroundings, is a portion of the case 13, facing the semiconductor-chip mounting parts 11a and 12a as well as their surroundings. Such a portion is, for instance, shown by virtual lines in FIG. 2.

A conventional semiconductor devices include cases with linear side surfaces. A joining material contracts when a semiconductor chip are joined to circuit patterns. This causes semiconductor-chip mounting parts of the circuit patterns to be drawn to the semiconductor chip. In other words, the semiconductor-chip mounting part of the lower circuit pattern is drawn upwardly to form an upward protuberance, and the semiconductor-chip mounting part of the upper circuit pattern is drawn downwardly to form a downward protuberance. Accordingly, the upper and lower circuit patterns warp. As a result, the parallelism between the upper circuit pattern and the lower circuit pattern degrades, thereby reducing the cooling performance of the semiconductor device.

The semiconductor device according to the preferred embodiment, in contrast, is designed such that the portion of the case 13, corresponding to the semiconductor-chip mounting parts 11a and 12a and to their surroundings has an up-and-down width greater than an up-and-down width of the remaining portions of the case 13, in order to prevent the semiconductor-chip mounting parts 11a and 12a of the circuit patterns from being drawn to the semiconductor chip 15 due to the contraction of the joining material. Such design enhances the rigidity of this portion with a greater up-and-down width, thereby preventing the semiconductor-chip mounting parts 11a and 12a of the circuit patterns 2 from being drawn to the semiconductor chip 15 due to the contraction of the joining material.

Consequently, the insulating material 14 is confined in the space defined by the cooling plates 11 and 12 with the parallelism between the upper and lower circuit patterns being maintained. The insulating material 14 is prevented from adhering to portions of the cooling plates 11 and 12, outside the case 13, particularly the heat-dissipation fins 4. This eliminates the need for additional processing such as cutting the adhered portions.

As describes above, the semiconductor device 100 according to the preferred embodiment is configured such that the case 13 is provided with a portion corresponding to the semiconductor-chip mounting parts 11a and 12a and to their surroundings. This portion has an up-and-down width greater than an up-and-down width of the remaining portions of the case 13. Such a configuration prevents the warps of the cooling plates 11 and 12 during the contraction of the joining material when the semiconductor chip 15 is joined to the cooling plates 11 and 12. Consequently, the upper cooling plate 12 and the lower cooling plate 11 maintain optimal parallelism therebetween, thereby preventing a reduction in cooling performance of the semiconductor device 100.

The semiconductor device according to the preferred embodiment is configured such that the case 13 has an up-and-down width that continuously varies. Such a configuration enables the portion of the case 13 to have increased rigidity compared to that of the conventional semiconductor device, the portion corresponding to a portion of the cooling plates 11 and 12, excluding the ends of the cooling plates 11 and 12, at which the semiconductor chip 15 is not disposed. Consequently, more semiconductor chips 15 are disposed in such portions.

The semiconductor device 100, which is a motor-vehicle semiconductor module, is advantageous to a motor-vehicle semiconductor device that requires high reliability and high heat-dissipation performance. The aforementioned configuration enables the semiconductor device 100 to be miniaturized, to have enhanced endurance, and to have an enhanced yield.

Modification

Figure 3:
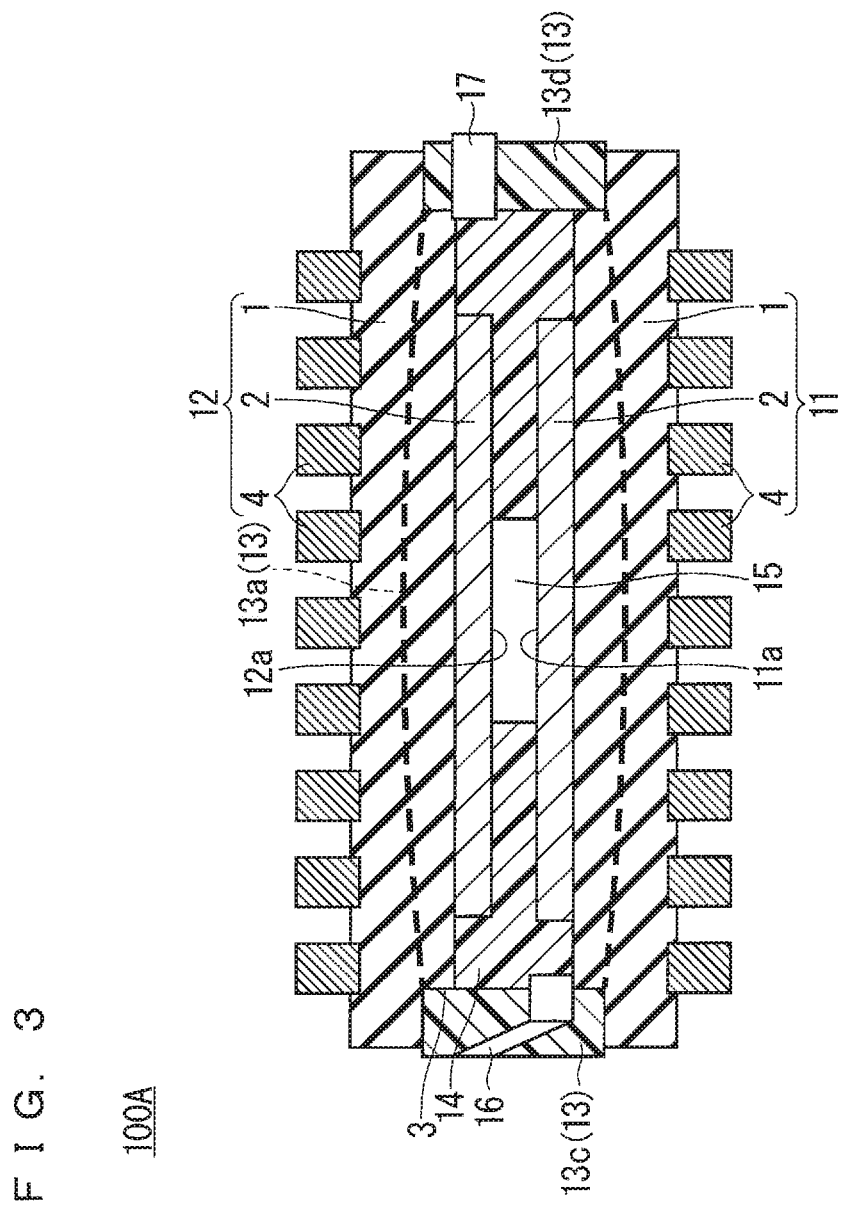
FIG. 3 is a cross-sectional view of a semiconductor device according to a modification of the preferred embodiment.

The following describes a modification of the preferred embodiment. FIG. 3 is a cross-sectional view of a semiconductor device 100A according to the modification of the preferred embodiment.

As illustrated in FIG. 3, the semiconductor device 100A includes the case 13 further provided with openings 16 and 17. Through the opening 16 or a first opening, the insulating material 14 is injected into the case 13. The opening 16 is located on the left side surface 13c. Through the opening 17 or a second opening, air is ejected when the insulating material 14 is injected into the case 13. The opening 17 is located on the right side surface 13d. The opening 17 faces the opening 16 and is located in a higher position than the opening 16. This prevents the insulating material 14, during its injection, from draining outside the case 13 together with the air within the case 13. Further, the insulating material 14 is sealed within the case 13. This prevents the insulating material 14 from adhering to the heat-dissipation fins 4 outside the case 13.

In some embodiments, the openings 16 and 17 are located on any of the front side surface 13a, the rear side surface 13b, the left side surface 13c, and the right side surface 13d provided that the openings 16 and 17 face each other.

As described above, the semiconductor device 100A according to the modification of the preferred embodiment includes the case 13 provided with the opening 16, through which the insulating material 14 is injected into the case 13, and the opening 17, through which air is ejected during the injection of the insulating material 14. In other words, the case 13 is provided with both the opening 16 for injection and the opening 17 for ejection. Consequently, the semiconductor device 100A has fewer components and thus is easier to be assembled. The opening 17 faces the opening 16 and is located in a higher position than the opening 16. This prevents the insulating material 14, during its injection, from draining outside the case 13 together with the air within the case 13.

It is noted that in the present invention, the individual embodiments can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a first cooling plate comprising a circuit pattern disposed on an insulator;
a second cooling plate facing the first cooling plate and comprising a circuit pattern disposed on an insulator;
a semiconductor chip joined between the circuit pattern of the first cooling plate and the circuit pattern of the second cooling plate with a joining material; and
a case having an opening at a center portion, the case holding outer peripheries of the first cooling plate and the second cooling plate, and the opening containing part of the first cooling plate, part of the second cooling plate, and the semiconductor chip,
wherein the semiconductor chip is directly mounted to a semiconductor-chip mounting part positioned at the center portion of the case and between the first cooling plate and the second cooling plate,
wherein the case comprises a plurality of sidewalls extending entirely around the opening, each of the plurality of sidewalls including a portion covering the semiconductor-chip mounting part and positioned at the center portion of the each of the plurality of sidewalls of the case, each sidewall portion having a width along a direction parallel to a center axis of the opening greater than widths along the direction of remaining portions of the sidewall of the case,
wherein the widths continuously vary, and
wherein an upper end of each of the plurality of sidewalls is upwardly protuberant as the upper end approaches the semiconductor-chip mounting part from an edge of the case in its lateral direction, and a lower end of each of the plurality of sidewalls is downwardly protuberant as the lower end approaches the semiconductor-chip mounting part from the edge of the case in its lateral direction.

2. The semiconductor device according to claim 1, wherein the case comprises a first side opening through which an insulating material is injected, and a second side opening through which air is ejected during the injection of the insulating material, and
wherein the second side opening faces the first side opening and is located in a higher position than the first opening.

3. The semiconductor device according to claim 1, wherein the semiconductor device is a motor-vehicle semiconductor module.

4. A semiconductor device comprising:
a first cooling plate comprising a circuit pattern disposed on an insulator;
a second cooling plate facing the first cooling plate and comprising a circuit pattern disposed on an insulator;
a semiconductor chip joined between the circuit pattern of the first cooling plate and the circuit pattern of the second cooling plate with a joining material; and
a case having an opening at a center portion, the case holding outer peripheries of the first cooling plate and the second cooling plate, and the opening containing part of the first cooling plate, part of the second cooling plate, and the semiconductor chip,
wherein the semiconductor chip is mounted in a semiconductor-chip mounting part positioned at the center portion of the case and between the first cooling plate and the second cooling plate,
wherein the case comprises a sidewall including a portion covering the semiconductor-chip mounting part and positioned at a center portion of the sidewall of the case, the sidewall center portion having a width along a direction parallel to a center axis of the opening, and the sidewall center portion width is greater than widths of the sidewall on each side of the sidewall center portion, wherein the widths continuously vary, and wherein an upper end of the case is upwardly protuberant as the upper end approaches the semiconductor-chip mounting part from an edge of the case in its lateral direction, and a lower end of the case is downwardly protuberant as the lower end approaches the semiconductor-chip mounting part from the edge of the case in its lateral direction.

5. The semiconductor device according to claim 4, wherein the case comprises a first side opening through which an insulating material is injected, and a second side opening through which air is ejected during the injection of the insulating material, and wherein the second side opening faces the first side opening and is located in a higher position than the first opening.

6. The semiconductor device according to claim 4, wherein the semiconductor device is a motor-vehicle semiconductor module.

7. A semiconductor device comprising:

a first cooling plate comprising a circuit pattern disposed on an insulator;

a second cooling plate facing the first cooling plate and comprising a circuit pattern disposed on an insulator;

a semiconductor chip joined between the circuit pattern of the first cooling plate and the circuit pattern of the second cooling plate with a joining material; and a case having an opening at a center portion, the case holding outer peripheries of the first cooling plate and the second cooling plate, and the opening containing part of the first cooling plate, part of the second cooling plate, and the semiconductor chip, wherein the semiconductor chip is mounted in a semiconductor-chip mounting part positioned at the center portion of the case and between the first cooling plate and the second cooling plate, wherein the opening is open in an up-and-down direction of the case, the up-and-down direction being a direction of stacking of the first cooling plate, the second cooling plate, and the semiconductor chip;

wherein the case comprises a sidewall including a portion covering the semiconductor-chip mounting part and positioned at the center portion of the sidewall of the case, the sidewall portion having a width along a direction parallel to a center axis of the opening greater than widths along the direction of remaining portions of the sidewall of the case, wherein the widths continuously vary, and wherein an upper end of the case is upwardly protuberant as the upper end approaches the semiconductor-chip mounting part from an edge of the case in its lateral direction, and a lower end of the case is downwardly protuberant as the lower end approaches the semiconductor-chip mounting part from the edge of the case in its lateral direction.

8. The semiconductor device according to claim 7, wherein the case comprises a first side opening through which an insulating material is injected, and a second side opening through which air is ejected during the injection of the insulating material, and wherein the second side opening faces the first side opening and is located in a higher position than the first opening.

9. The semiconductor device according to claim 7, wherein the semiconductor device is a motor-vehicle semiconductor module.

\* \* \* \* \*